US006554907B2

(12) United States Patent
Beer et al.

(10) Patent No.: US 6,554,907 B2
(45) Date of Patent: Apr. 29, 2003

(54) SUSCEPTOR WITH INTERNAL SUPPORT

(75) Inventors: Emanuel Beer, San Jose, CA (US); Robin Tiner, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 120 days.

(21) Appl. No.: 09/753,151

(22) Filed: Jan. 2, 2001

(65) Prior Publication Data

US 2002/0084036 A1 Jul. 4, 2002

(51) Int. Cl.[7] ........................................ C23C 016/000
(52) U.S. Cl. ............ 118/728; 156/345.23; 156/345.51; 156/345.52
(58) Field of Search ................. 118/728, 724, 118/725, 732; 156/345.51, 345.52, 345.23; 414/935; 438/800

(56) References Cited

U.S. PATENT DOCUMENTS

| 3,549,847 | A | * | 12/1970 | Clark et al. ............... 219/10.49 |
|---|---|---|---|---|
| 3,998,180 | A | | 12/1976 | Hawkins et al. |
| 5,232,507 | A | | 8/1993 | Ohtoshi et al. |
| 5,266,527 | A | * | 11/1993 | Robbins ....................... 437/225 |
| 5,566,043 | A | | 10/1996 | Kawada et al. |
| 5,665,260 | A | | 9/1997 | Kawada et al. |
| 6,035,101 | A | | 3/2000 | Sajoto et al. |
| 6,120,661 | A | | 9/2000 | Hirano et al. |
| 6,160,244 | A | | 12/2000 | Ohashi |
| 6,188,150 | B1 | * | 2/2001 | Spence ......................... 310/12 |
| 6,188,838 | B1 | | 2/2001 | Mikata et al. |
| 6,204,486 | B1 | | 3/2001 | Masaki et al. |
| 6,280,584 | B1 | * | 8/2001 | Kumar et al. .......... 204/298.15 |
| 6,294,771 | B2 | | 9/2001 | Katsuda et al. |
| 6,230,649 | B1 | * | 11/2001 | Miyajima et al. .............. 355/72 |

FOREIGN PATENT DOCUMENTS

| DE | 44 46 992 | | 12/1994 | |
|---|---|---|---|---|
| JP | 01-286339 | | 11/1989 | |
| JP | 07031886 | * | 2/1995 | ........... B01D/53/86 |
| JP | 11-330115 | | 11/1999 | |
| WO | WO 01/11431 A2 | * | 2/2001 | ............. G03F/7/20 |
| WO | WO 01/38600 | | 5/2001 | |

OTHER PUBLICATIONS

U.S. patent application, Ser. No. 09/399,900 filed Sep. 21, 1999, entitled Support Frame for Substrates.

* cited by examiner

Primary Examiner—Gregory Mills
Assistant Examiner—Karla Moore
(74) Attorney, Agent, or Firm—Dugan & Dugan

(57) ABSTRACT

In a first embodiment, a susceptor is provided having a substrate supporting surface and an internal support frame that provides mechanical strength in a plane orthogonal to the substrate supporting surface, and provides flexibility in a plane parallel to the substrate supporting surface.

24 Claims, 5 Drawing Sheets

SUSCEPTOR WITH INTERNAL SUPPORT

BACKGROUND OF THE INVENTION

A flat panel display (FPD) typically comprises a glass or a glass like substrate having an array of thin-film transistors formed thereon. To form the array, the substrate is subjected to various high temperature processing steps (e.g., chemical vapor deposition), many of which also require corrosive gases. Typical temperatures for chemical vapor deposition (CVD) processes can reach about 300° C. or higher. At these temperatures a substrate is at risk of experiencing non-uniform processing which can degrade display quality. Specifically, in order to process uniformly across its entire surface, a substrate must be flat during processing. Thus, non-uniform processing may occur when the platform that supports the substrate deforms, causing the substrate to deform therewith. Platforms that support substrates during processing are conventionally known as susceptors, and are conventionally made of aluminum because of aluminum's excellent corrosion resistance when exposed to CVD processing chemicals. The strength of aluminum, however, begins to decline rapidly above 150° C. In fact, aluminum begins to soften at 250° C. and exhibits "liquid" type properties at about 660° C. Thus, when exposed to typical CVD processing temperatures, aluminum susceptors may deflect (e.g., bend or droop at the edges when supported at the center as is conventional). Such deflection is further exacerbated by the current trend toward larger and larger display sizes. Current display sizes are about 550 mm×650 mm, and are projected to reach well above a square meter in the near future. As display size increases, so does susceptor size and the deflection associated therewith.

Accordingly, a susceptor that resists deflection during high temperature processing is needed.

SUMMARY OF THE INVENTION

In one aspect the present invention provides a susceptor having a substrate supporting surface and an internal support frame that provides mechanical strength in a plane orthogonal to the substrate supporting surface, and provides flexibility in a plane parallel to the substrate supporting surface. The inventive susceptor may comprise a stainless-steel (or some other high strength material or compound) internal support frame that is cast within aluminum. Thus, the aluminum forms the substrate supporting surface. In this aspect the support frame is configured in a design that provides open areas in the plane parallel to the substrate supporting surface (i.e., in the plane parallel to the substrate supporting surface the support frame is not solid). The design may comprise, for example, a plurality of multi-sided shapes having straight and/or curved sides. Exemplary designs may comprise a honeycomb or wave pattern, as further described below. When the internal support frame is cast within aluminum, the aluminum occupies the open areas defined by the stainless-steel support frame.

The internal support frame may comprise one or more thin stainless-steel "components" or "members" that have a larger dimension in the plane orthogonal to the substrate supporting surface, than in the plane parallel to the substrate supporting surface. Thus the members are more flexible in the plane parallel to the substrate supporting surface, than they are in the plane orthogonal to the substrate supporting surface.

Other features and aspects of the present invention will become more fully apparent from the following detailed description of the preferred embodiments, the appended claims and the accompanying drawings.

DETAILED DESCRIPTION OF THE PREFERRED EMBODIMENTS

Figure 1:
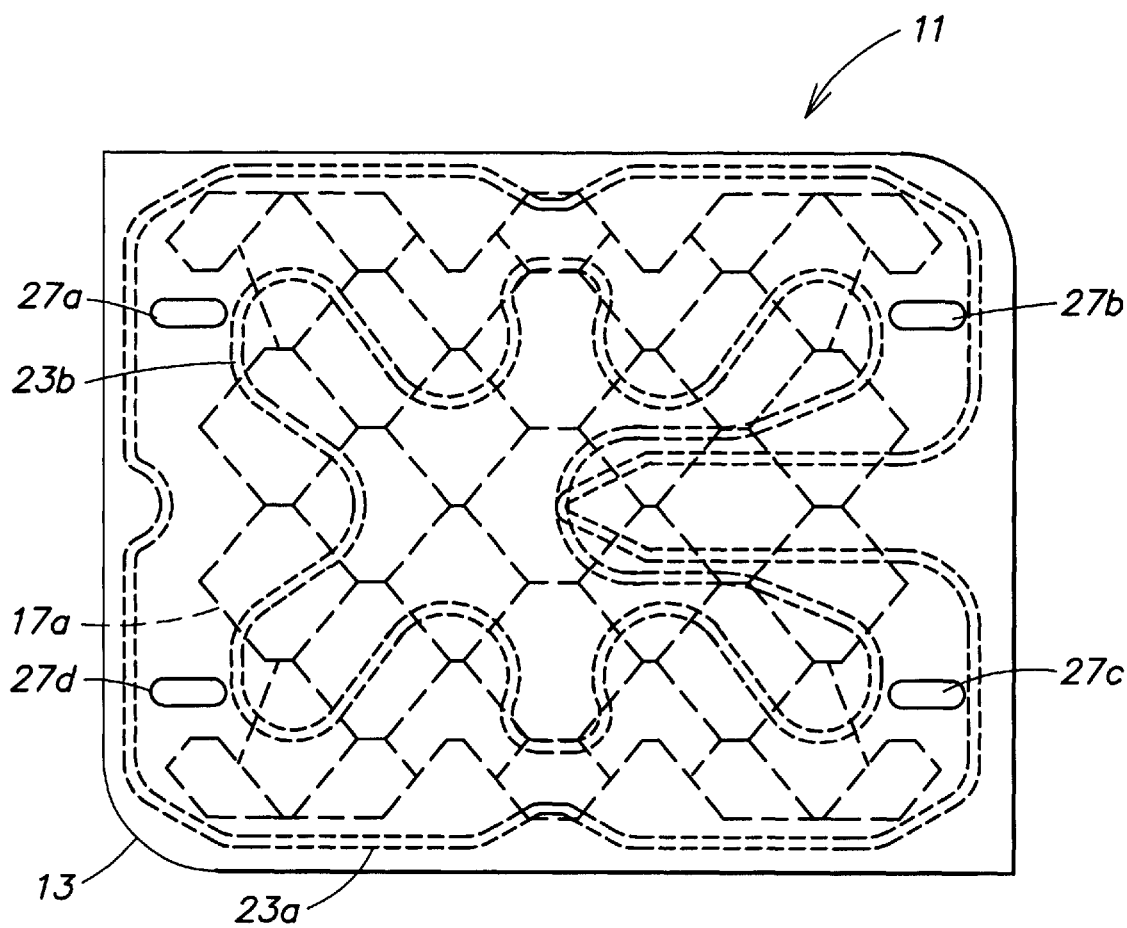
FIG. 1 is a top plan view of the inventive susceptor, showing a first embodiment of the support frame encased therein.

FIG. 1 is a top plan view of an inventive susceptor 11, showing a first embodiment 17a of an internal support frame. The support frame 17a is configured so as to provide mechanical strength in a plane orthogonal to a substrate supporting surface 15 (best shown in FIG. 2A and FIG. 4) and to provide flexibility in a plane parallel to the substrate supporting surface 15. One method for obtaining strength in a plane orthogonal to the substrate supporting surface 15 and flexibility in a plane parallel to the substrate supporting surface 15, is to build the support frame 17a from one or more components configured as shown and described with reference to FIGS. 2A and 2B.

Figure 2A:
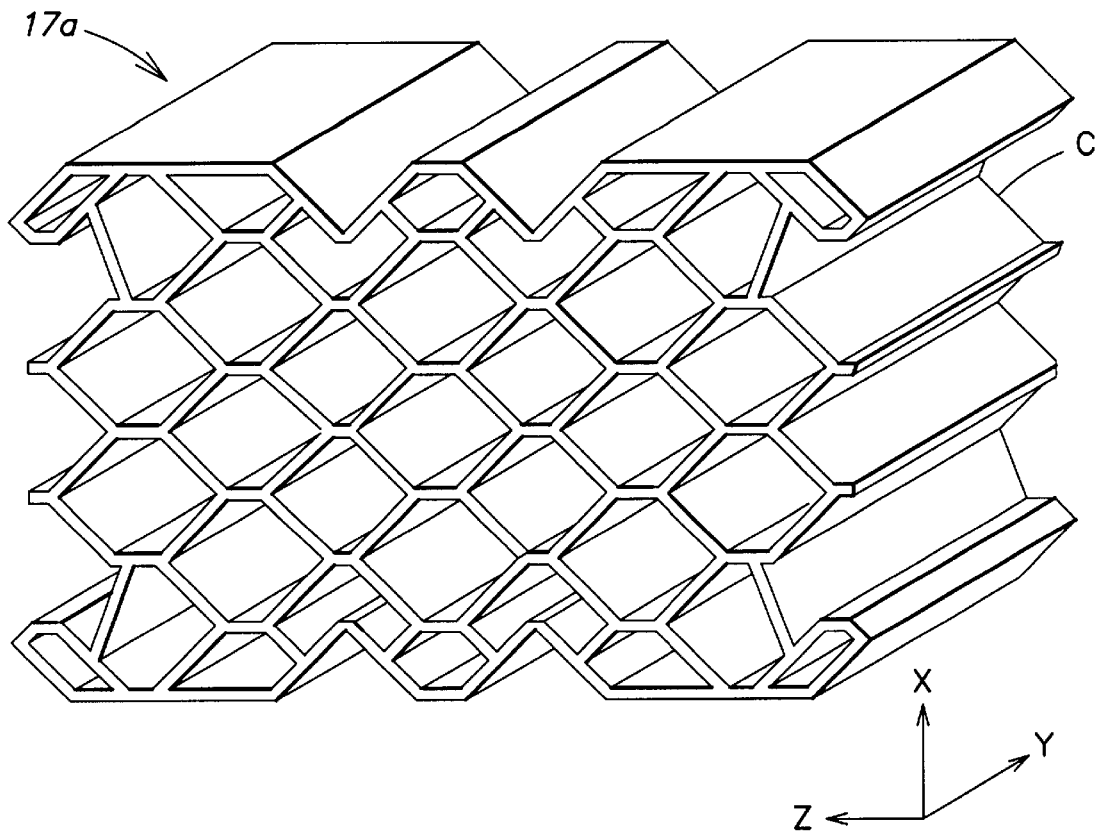
FIG. 2A is a perspective view of the support frame of FIG. 1.
Figure 2B:
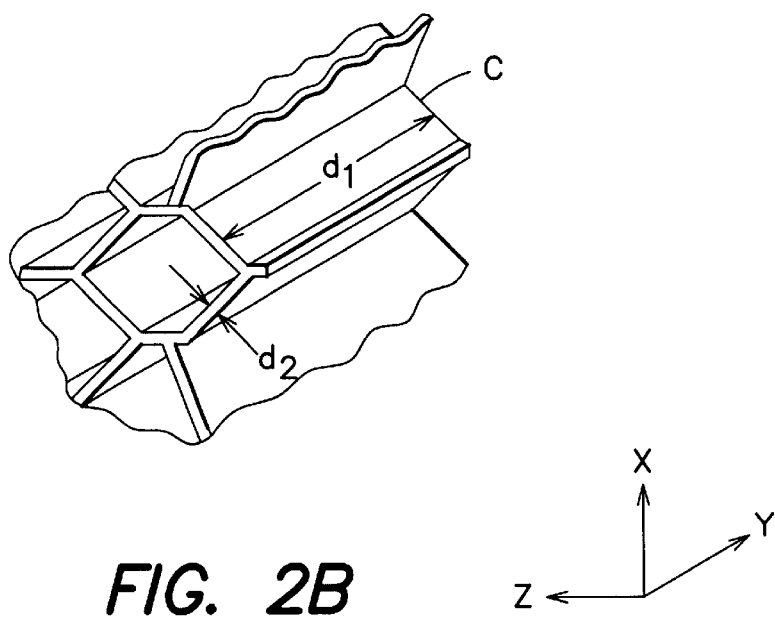
FIG. 2B is an enlarged perspective view of a component which is bent or joined to other such components so as to form the support frame of FIG. 2A.
Figure 3:
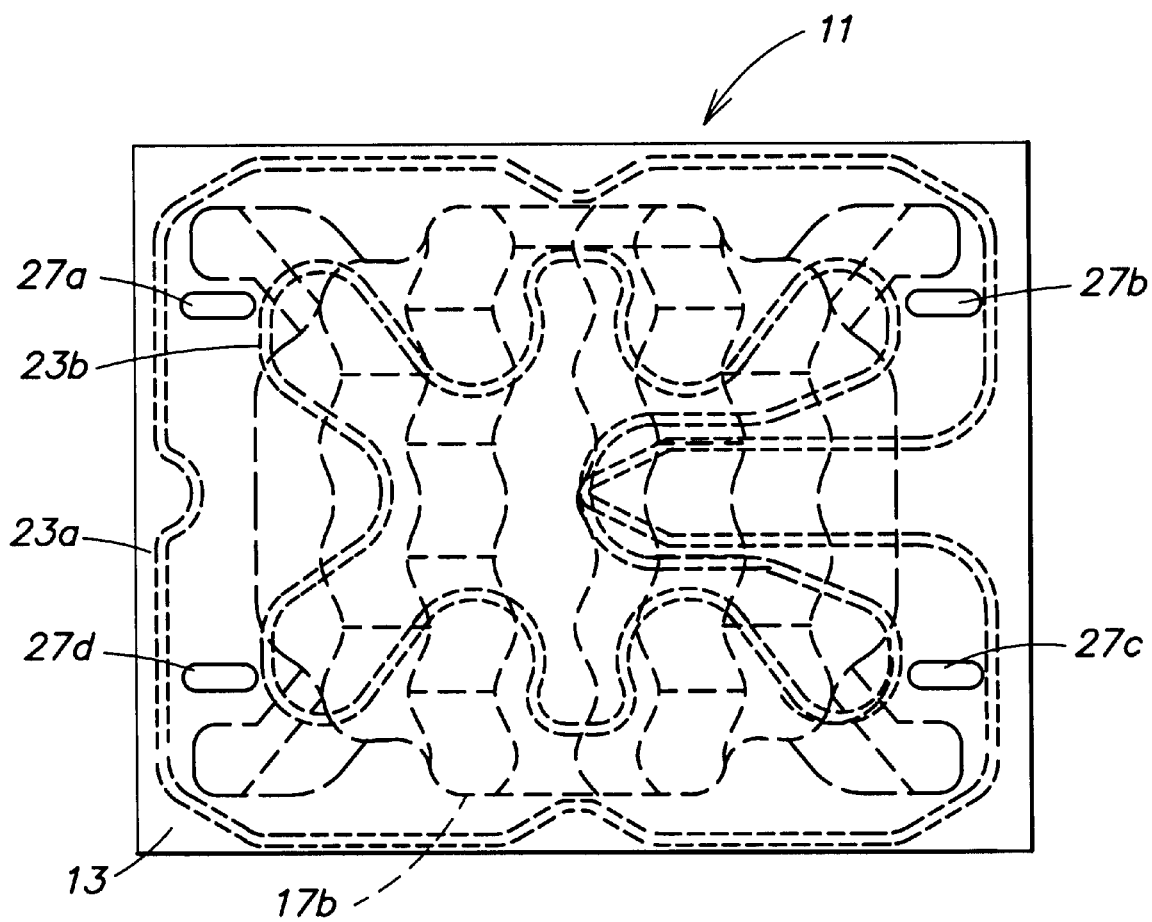
FIG. 3 is a top plan view of the inventive susceptor, showing a second embodiment of the support frame encased therein.

FIG. 2A is a perspective view of the support frame 17a of FIG. 1; and FIG. 2B is an enlarged side perspective view of one of the high-aspect-ratio components C of the support frame 17a of FIG. 2A. In general such components may be either joined to other such components or bent so as to form a support frame 17 having any desired pattern (e.g., having a wave pattern as shown in FIG. 3 or having a honeycomb pattern as shown in FIG. 1). Each component C has a high aspect ratio because it has a larger dimension ("$d_1$") in a plane in which mechanical strength is desired (e.g., in the plane orthogonal to the substrate supporting surface 15, such as the X–Y plane in FIGS. 2A and 2B), than the dimension ("$d_2$") in the plane in which flexibility is desired (e.g., in the plane parallel to the substrate supporting surface, such as the X–Z plane in FIGS. 2A and 2B). For example, in the case of a conventional susceptor that supports a substrate along a top surface of the susceptor, the support frame 17 may be formed of components that are tall and thin. In one aspect, the dimension $d_1$ of component C may be 10–20 times larger than the dimension $d_2$ (e.g., the component C may be 35–40 mm tall, and 1.5–2 mm wide).

To provide further flexibility, the support frame 17a may be configured so as to have "open-areas" (prior to being cast within aluminum, as described with reference to FIG. 4) in the plane in which flexibility is desired. In the examples of FIGS. 1 and 3, the support frames 17a (FIG. 1), 17b (FIG. 3) have open-areas (defined by the components C) along a plane parallel to the substrate supporting surface 15. Such open-areas not only reduce the mass of the support frame 17a, 17b, but also allow the support frame 17a, 17b to flex in the plane parallel to the substrate supporting surface 15 when the support frame 17a, 17b and the aluminum exterior, in which the support frame 17a, 17b is cast, expand by different amounts (e.g. during thermal cycling) due to their differing coefficients of thermal expansion. The support frame 17a, 17b may further encourage flexing in the plane parallel to the substrate supporting surface 15 by arranging the one or more components C in a wave pattern (such as the pattern of FIG. 3) or in an angular pattern (such as the honeycomb pattern of FIG. 1) so that the waves or angles are oriented in the plane parallel to the substrate supporting surface 15 (as shown). It will be understood that the patterns shown in FIGS. 1 and 3 are merely exemplary and that other configurations having larger or smaller waves or angles, or having other patterns, may be similarly employed (e.g., other high aspect ratio, similarly shaped, and/or high strength or "stiffness" materials may be employed).

Also shown in FIGS. 1 and 3 are two (or more) heating elements (shown in phantom); an outer heating element 23a which extends around an outer perimeter of the substrate supporting surface 15, and an inner heating element 23b which extends around an inner portion of the substrate supporting surface 15. A plurality of apertures 27a-d may be formed through the substrate supporting surface 15 in regions where neither the support frame 17 nor the heating elements 23a-b are exposed by the apertures 27a-d. Thus, a plurality of lift pins (FIG. 5) may extend through the apertures 27a-d as further described with reference to the processing chamber of FIG. 5.

Figure 4:
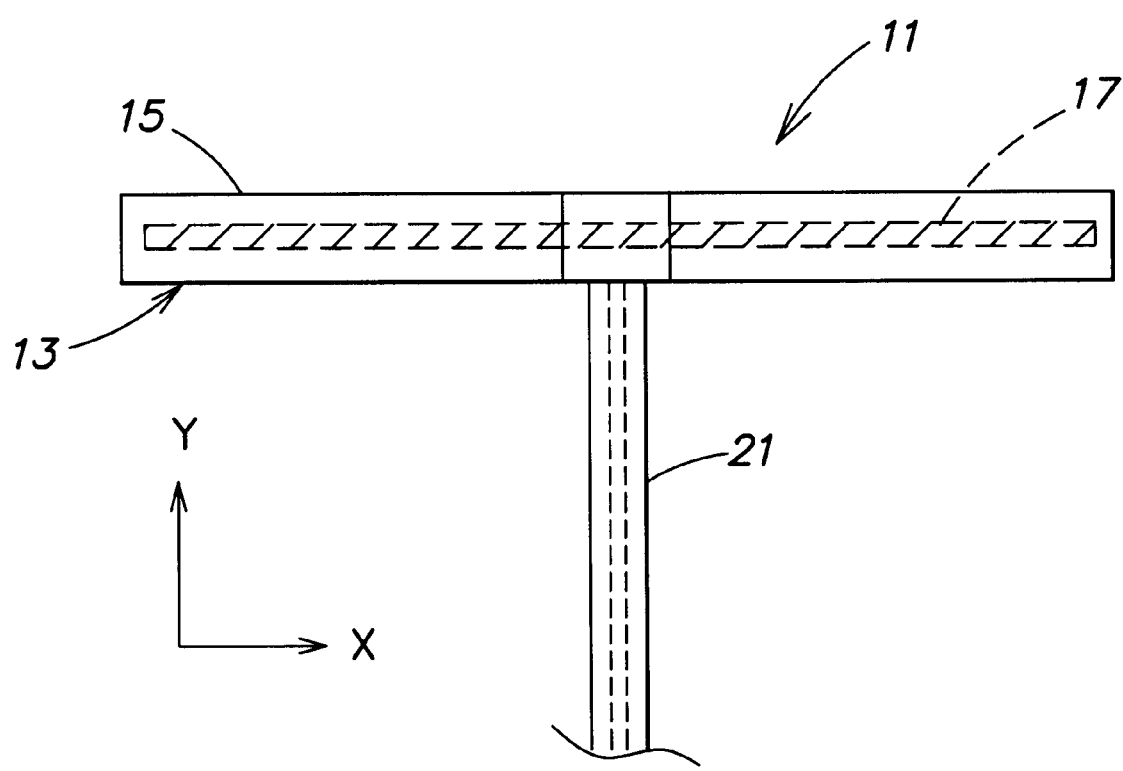
FIG. 4 is a side schematic view of the inventive susceptor of either FIG. 1 or FIG. 3.

FIG. 4 is a side schematic view of the inventive susceptor 11, which shows an exemplary position of a support frame 17 encased within the inventive susceptor 11. The inventive susceptor 11 comprises an aluminum exterior surface 13 adapted to support a substrate (not shown) via a substrate supporting surface 15.

As shown in FIG. 4, the aluminum exterior surface 13 encases the support frame 17. Accordingly the support frame 17 provides the susceptor 11 with mechanical strength at temperatures that approach or exceed typical processing temperatures (e.g., 300° C. or higher). Although aluminum is the preferred material for encasing the support frame 17, other "exterior" or encasing materials that are vacuum compatible and that resist corrosion when exposed to chemicals employed during processing may be employed (e.g., oxygen, halogens (F, Cl, Br, I, etc.), halogen compounds, atomic form halogens such as fluorine atoms/ions, etc.) The support frame 17 is preferably stainless steel or a material that exhibits similar strength at typical processing temperatures (e.g., 300° C. and higher) and is preferably cast within the exterior material as is known in the art. Other exemplary support frame materials include high strength materials (e.g., steel, titanium, etc.) or compounds (e.g., metal matrix composites, mixtures of aluminum and ceramics, etc.).

In general, to make the inventive susceptor 11 via casting, the support frame 17 may be placed within a mold that provides the desired shape of the exterior surface 13. Molten aluminum then may be poured into the mold so as to encase the frame therewithin.

The support frame 17 may be positioned within the inventive susceptor 11 so as to extend along a plane parallel to the substrate supporting surface 15. While the support frame 17 is shown to be in the center of the susceptor 11 in FIG. 4, it will be understood that the support frame 17 may be offset from the center of the susceptor 11 either away from or toward the substrate supporting surface 15. As shown in FIG. 4, a pedestal 21 may be coupled to the inventive susceptor 11 or integrally formed therewith. The inventive susceptor 11 may optionally include a heating element 23, and the pedestal 21 may provide a conduit through which the heating element 23 may extend in order to couple to a remote power source (e.g., which may be located outside a chamber in which the inventive susceptor 11 may be contained).

Inventive susceptors such as those described above can be employed within any high-temperature processing chamber, and are particularly well suited for use in high temperature processes such as the chemical vapor deposition (CVD) of polysilicon. An exemplary CVD chamber that may be employed to deposit polysilicon is shown and described with reference to FIG. 5.

Figure 5:
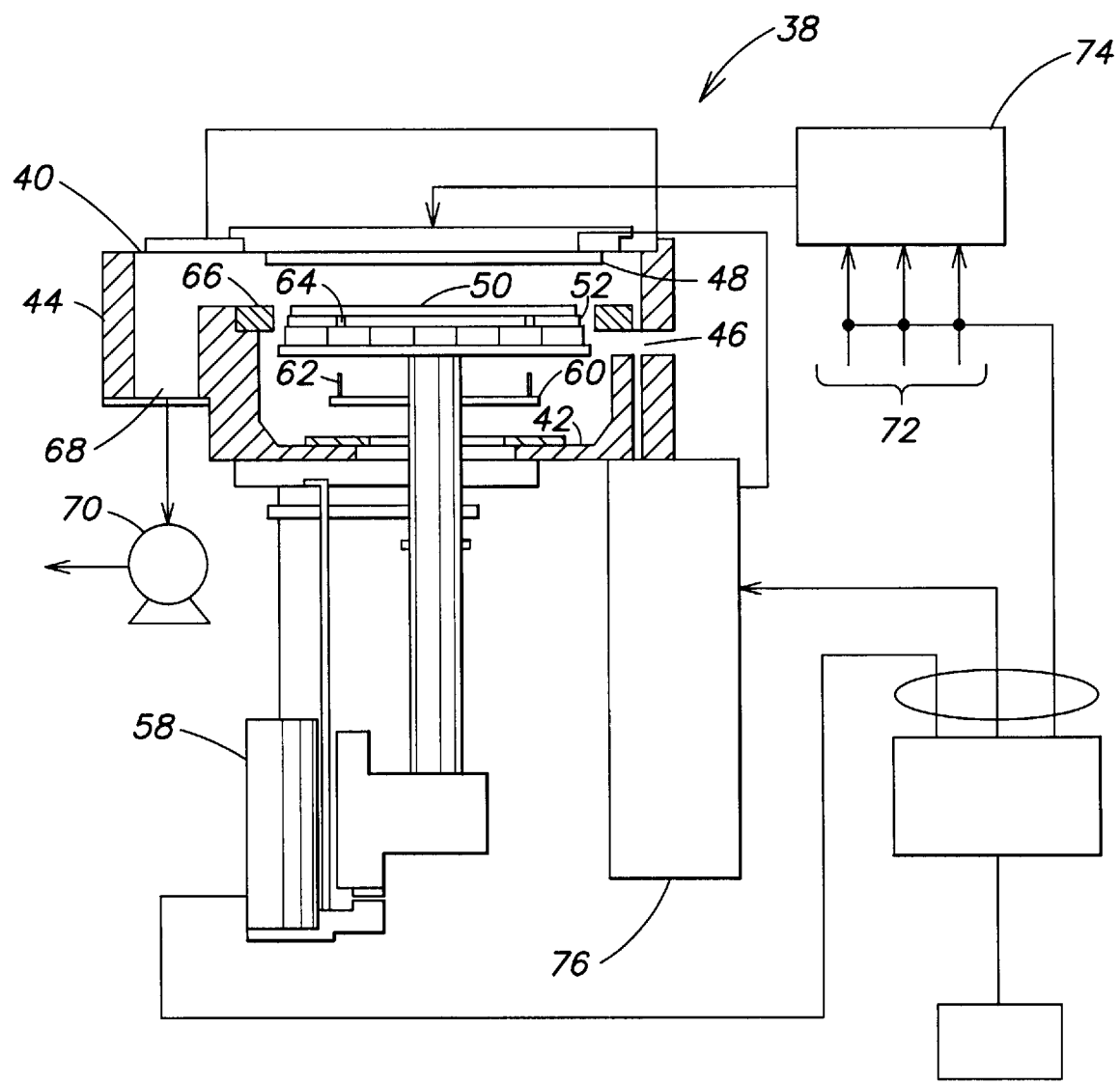
FIG. 5 is a schematic side view of a chemical vapor deposition chamber that may employ the inventive susceptor.

FIG. 5 is a schematic side view of a chemical vapor deposition (CVD) chamber 38, such as a CVD chamber available from AKT, Inc. having offices in Santa Clara, Calif. The chamber 38 is a parallel plate CVD chamber having a top 40, a bottom 42, sidewalls 44 and an opening 46 disposed in the sidewall through which substrates are delivered and retrieved from the chamber. Chamber 38 contains a gas distribution manifold 48, known as a diffuser, for dispersing process gases through perforated holes in the manifold to a substrate 50 that rests on a susceptor 52, which may be configured in accordance with the invention.

By configuring the susceptor 52 in accordance with the invention, it may be possible to achieve more rapid and uniform substrate heating. The susceptor 52 and the substrate 50 supported on the susceptor 52 can be controllably moved by a lift motor 58, known as a Z-drive, to adjust the spacing between the manifold 48 and the substrate 50. The spacing between the manifold 48 and the substrate 50 typically ranges between about 200 mils to about 1000 mils. The susceptor 52 is movable between a lower loading/off-loading position and an upper processing position that is closely adjacent to the manifold 48. A lift plate 60 having lift pins 62 is disposed below the susceptor 52. When the susceptor 52 is lowered, the lift pins 62 protrude through holes 64 in the susceptor 52 to lift the substrate 50 from the susceptor and facilitate delivery and retrieval of the substrate 50 to and from the chamber 38. An insulator 66 may surround the susceptor 52 and the substrate 50.

Deposition and carrier gases are input through gas supply lines 72 into a mixing system 74 where they are combined and then sent to manifold 48. Alternatively, the mixing system 74 may be omitted and the gases flown to the manifold 48 directly. During processing, gases flown to manifold 48 are uniformly distributed across the surface of the substrate. The gases exhaust through a port 68 by a vacuum system 70 having a throttle valve (not shown) to control the pressure in the chamber 38 by controlling the exhaust rate of gas from the chamber 38.

The deposition process performed in chamber 38 can be any process, such as a thermal process or a plasma-enhanced process. In a plasma-enhanced process, a controlled plasma is formed adjacent to the substrate by RF energy applied from an RF power supply 76 to the gas distribution manifold 48, or to another plasma energizing device or structure. The susceptor 52 is grounded and the manifold 48 is electrically isolated from the chamber surfaces. The plasma creates a reaction zone between the gas distributor manifold 48 and the substrate 50 that enhances the reaction between the process gases.

A susceptor configured in accordance with the present invention may contribute significantly to the value of the processing chamber 38 by enabling substrates to receive more uniform processing. While the above system is exemplary, the invention has application in any arrangement that supports a substrate, and, thus, it is understood that other applications of the invention are contemplated. While described as horizontally oriented, other susceptor orientations may be employed such as a vertically oriented susceptor or a tilted susceptor that is tilted from a horizontal or a vertical position.

The foregoing description discloses only the preferred embodiments of the invention, modifications of the above disclosed apparatus and method which fall within the scope of the invention will be readily apparent to those of ordinary skill in the art. For instance, although the inventive susceptor has been described with reference to the processing of flat panel displays, it will be understood that the inventive susceptor may be advantageously employed within any high temperature process (i.e., 300° C. and higher) that requires the support of large (i.e., greater than 300 mm in one direction) substrates. Accordingly, the term "substrate" refers to any large thin object including flat panel displays, semiconductor substrates, etc. Other exemplary high temperature processes which may benefit from use of the inventive susceptor include physical vapor deposition, etc.

Accordingly, while the present invention has been disclosed in connection with the preferred embodiments thereof, it should be understood that other embodiments may fall within the spirit and scope of the invention, as defined by the following claims.

What is claimed is:

1. A susceptor comprising:
   an exterior surface having a substrate supporting surface adapted to support a substrate, the exterior surface comprising a first material; and
   a support frame, encased within the first material, having a configuration that provides mechanical strength in a plane orthogonal to the substrate supporting surface, and flexibility in a plane parallel to the substrate supporting surface, the support frame comprising a second material.

2. The susceptor of claim 1 wherein the second material has a higher mechanical strength at a processing temperature than the first material.

3. The susceptor of claim 2 wherein the processing temperature is at least 300° C.

4. The susceptor of claim 2 wherein the first material is aluminum and wherein the second material is stainless steel.

5. The susceptor of claim 1 wherein the plane orthogonal to the substrate supporting surface is a vertical plane and wherein the plane parallel to the substrate supporting surface is a horizontal plane.

6. The susceptor of claim 1 further comprising a heater enclosed within the first material.

7. The susceptor of claim 1 wherein the support frame is comprised of one or more components that have a larger dimension in a plane orthogonal to the substrate supporting surface than in a plane parallel to the substrate supporting surface.

8. The susceptor of claim 7 wherein the one or more components are arranged in an open design.

9. The susceptor of claim 7 wherein the open design has open space in the plane parallel to the substrate supporting surface.

10. The susceptor of claim 9 wherein the open design is a honeycomb design in the plane parallel to the substrate supporting surface.

11. The susceptor of claim 9 wherein the one or more components are arranged in a wave pattern in the plane parallel to the substrate supporting surface.

12. The susceptor of claim 9 wherein the one or more components are arranged in an angular pattern in the plane parallel to the substrate supporting surface.

13. The susceptor of claim 9 wherein the one or more components comprise a plurality of components that are welded in an angular pattern in the plane parallel to the substrate supporting surface.

14. The susceptor of claim 13 wherein the angular pattern comprises a non-orthogonally angled pattern.

15. The susceptor of claim 7 wherein the second material has a higher mechanical strength at a processing temperature than the first material.

16. The susceptor of claim 15 wherein the processing temperature is at least 300° C.

17. The susceptor of claim 15 wherein the first material is aluminum and wherein the second material is stainless steel.

18. The susceptor of claim 15 wherein the exterior surface of the susceptor is sized so as to support a substrate having a size of at least a 550 mm×650 mm.

19. The susceptor of claim 18 wherein the first material is vacuum compatible and resists corrosion when exposed to an environment containing at least one of a halogen, a halogen compound and an atomic form halogen.

20. A chamber comprising:
   a chamber wall that encloses a processing region;
   a vacuum pump coupled to the processing region and adapted to evacuate the processing region;
   a source of processing gas coupled to the processing region so as to flow processing gas thereto; and
   the susceptor of claim 1 contained within the processing region.

21. The chamber of claim 19 wherein the susceptor further comprises a heater encased in the first material, wherein the heater is adapted to heat the susceptor to temperatures of 300° C. or more.

22. A process for making a susceptor adapted to support a substrate, comprising:
   providing a support frame having a configuration that provides mechanical strength in a vertical plane, and flexibility in a horizontal plane; and
   encasing the support frame in an exterior material adapted to support a substrate;
   wherein the support frame comprises a material that has a higher mechanical strength at a processing temperature than the exterior material.

23. A susceptor comprising:
   a substrate supporting surface adapted to support the substrate; and
   a support frame positioned below the substrate supporting surface, the support frame being encased within a first material and being formed of a second material that is different from the first material, the support frame having a configuration that provides mechanical strength in a plane orthogonal to the substrate supporting surface and flexibility in a plane parallel to the substrate supporting surface, the support frame being formed of one or more components that have a larger dimension in a plane orthogonal to the substrate supporting surface than in a plane parallel to the substrate supporting surface.

24. The susceptor of claim 23, wherein the first material is aluminum and the second material is stainless steel.

* * * * *